United States Patent [19]
Furuya et al.

[11] Patent Number: 5,428,242
[45] Date of Patent: Jun. 27, 1995

[54] SEMICONDUCTOR DEVICES WITH SHIELDING FOR RESISTANCE ELEMENTS

[75] Inventors: Yasunari Furuya; Kazuko Moriya, both of Suwa, Japan

[73] Assignee: Seiko Epson Corporation, Tokyo, Japan

[21] Appl. No.: 965,545

[22] Filed: Oct. 23, 1992

Related U.S. Application Data

[63] Continuation-in-part of Ser. No. 548,879, filed as PCT/JP89/01180, Nov. 21, 1989, abandoned.

[30] Foreign Application Priority Data

| | | | |
|---|---|---|---|
| Nov. 22, 1988 | [JP] | Japan | 63-295083 |
| Mar. 31, 1989 | [JP] | Japan | 1-81094 |
| Nov. 8, 1989 | [JP] | Japan | 1-290499 |

[51] Int. Cl.$^6$ ............ H01L 27/01; H01L 27/04; H01L 23/60
[52] U.S. Cl. ............ 257/538; 257/659
[58] Field of Search ............ 357/51, 59, 53, 84; 257/538, 630, 659

[56] References Cited

U.S. PATENT DOCUMENTS

| | | | |
|---|---|---|---|
| 4,263,518 | 4/1981 | Ballatone et al. | 357/51 |
| 4,321,616 | 3/1982 | Bise | 357/51 |
| 4,326,213 | 4/1982 | Shirai et al. | 357/59 F |
| 4,367,580 | 1/1983 | Guterman | 357/59 F |
| 4,377,819 | 3/1983 | Sakai et al. | 357/51 |
| 4,455,567 | 6/1984 | Lee et al. | 357/59 F |
| 4,514,749 | 4/1985 | Shoji | 357/84 |
| 4,609,935 | 9/1986 | Kondo | 357/84 |

FOREIGN PATENT DOCUMENTS

| | | |
|---|---|---|
| 54-49082 | 4/1979 | Japan . |
| 55-123157 | 9/1980 | Japan . |
| 56-50553 | 5/1981 | Japan . |
| 59-18670 | 1/1984 | Japan . |
| 62-98815 | 5/1987 | Japan . |

*Primary Examiner*—William D. Larkins
*Attorney, Agent, or Firm*—W. Douglas Carothers, Jr.

[57] ABSTRACT

A semiconductor device provides for shielding of resistance elements as well as other elongated passive or active components formed in the structure by diffusion of impurities into a polycrystalline silicon layer or a semiconductor substrate and a conductor is formed on an upper surface of the resistance element having a resistance value lower than that of the formed resistance element. Also, the conductor is formed so as to hold a fixed potential value. This structure prevents an invasion or infiltration of impurities which causes a variation in the resistance value of the resistance element. Further, the conductor functions as shielding from noise from a signal line in close proximity to the resistance element or from external noise by means of fixing the conductor at a fixed potential value thereby maintaining the stability of the resistance value of the resistance element.

16 Claims, 11 Drawing Sheets

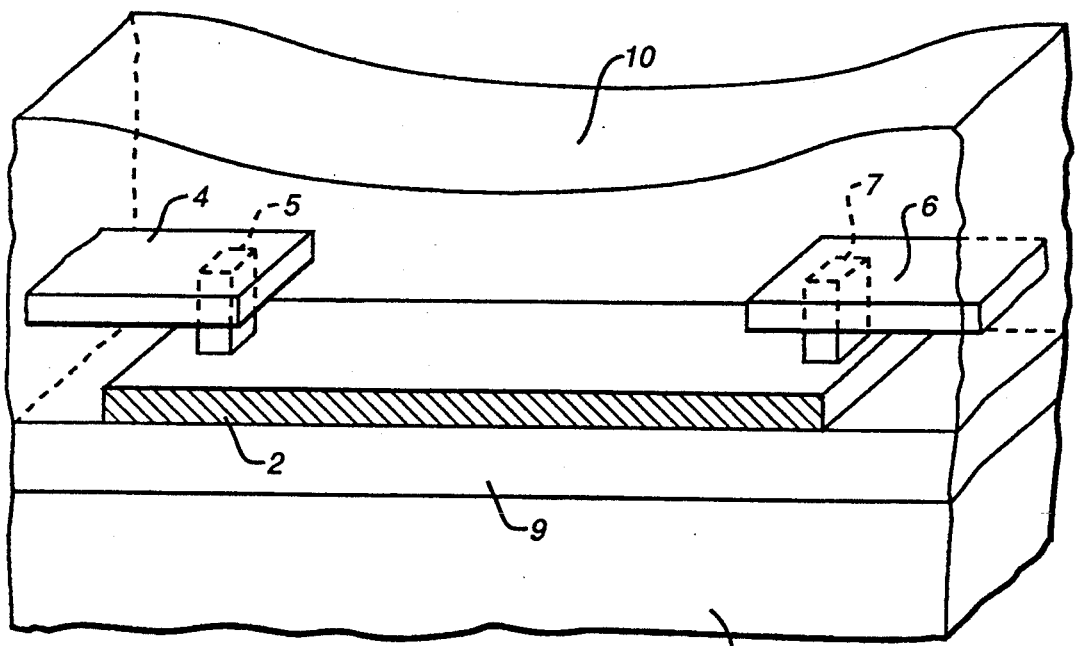
FIG._1
(PRIOR ART)
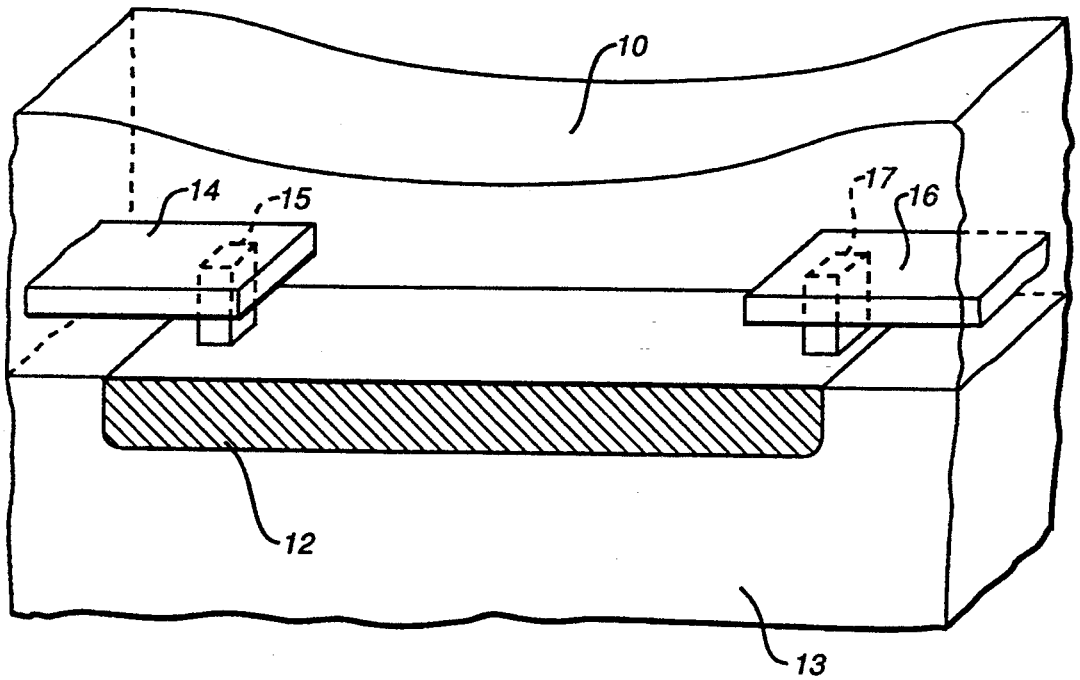
FIG._2
(PRIOR ART)

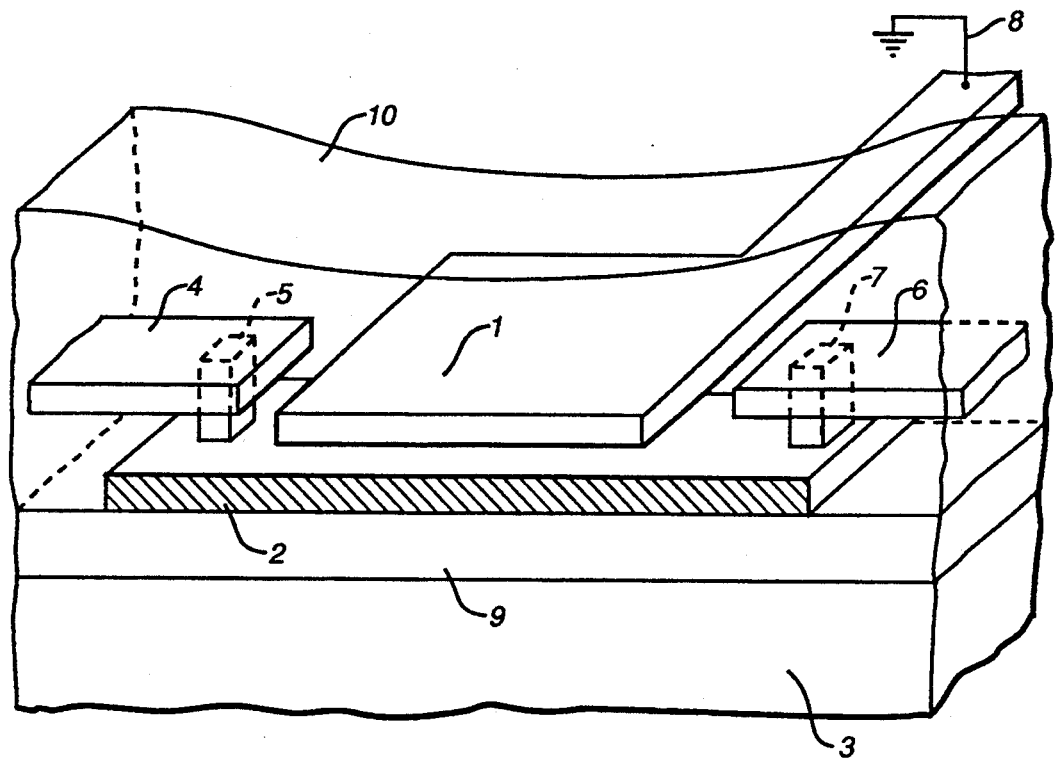
FIG._3
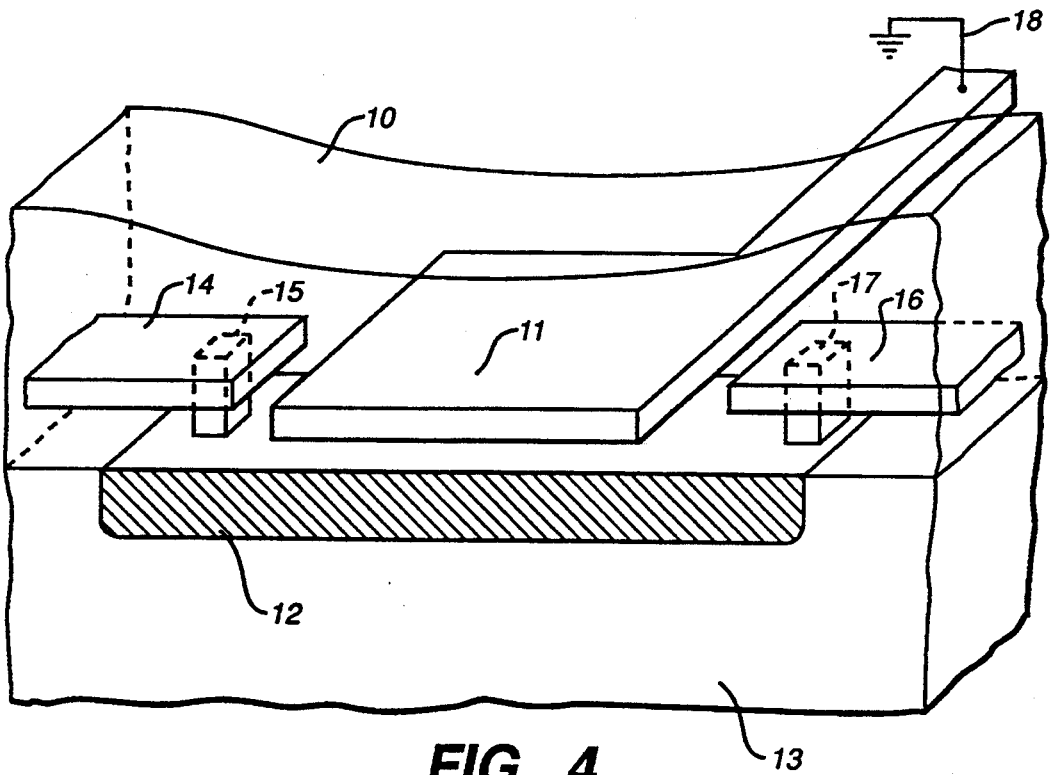
FIG._4

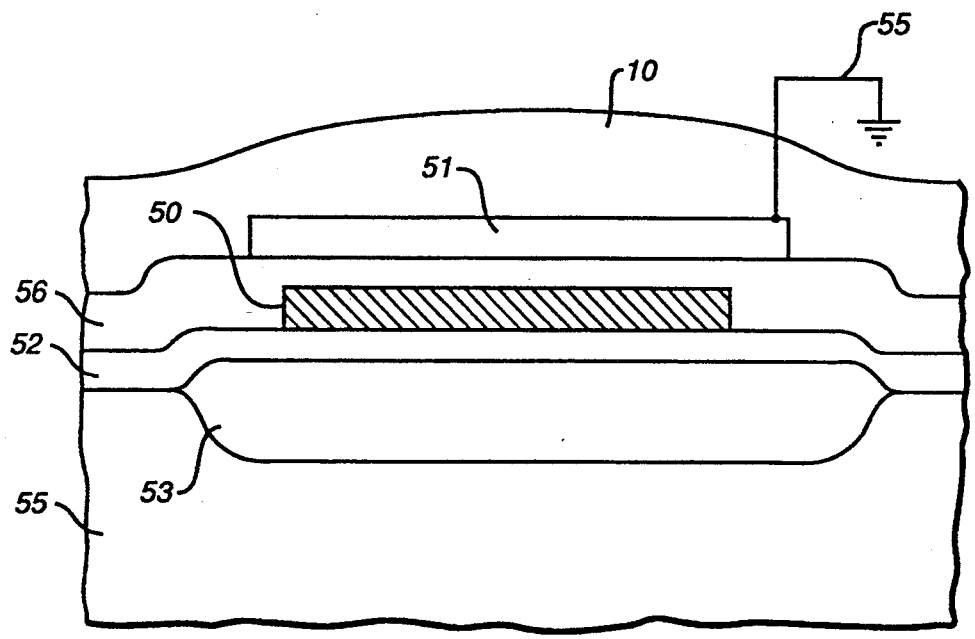
FIG._5
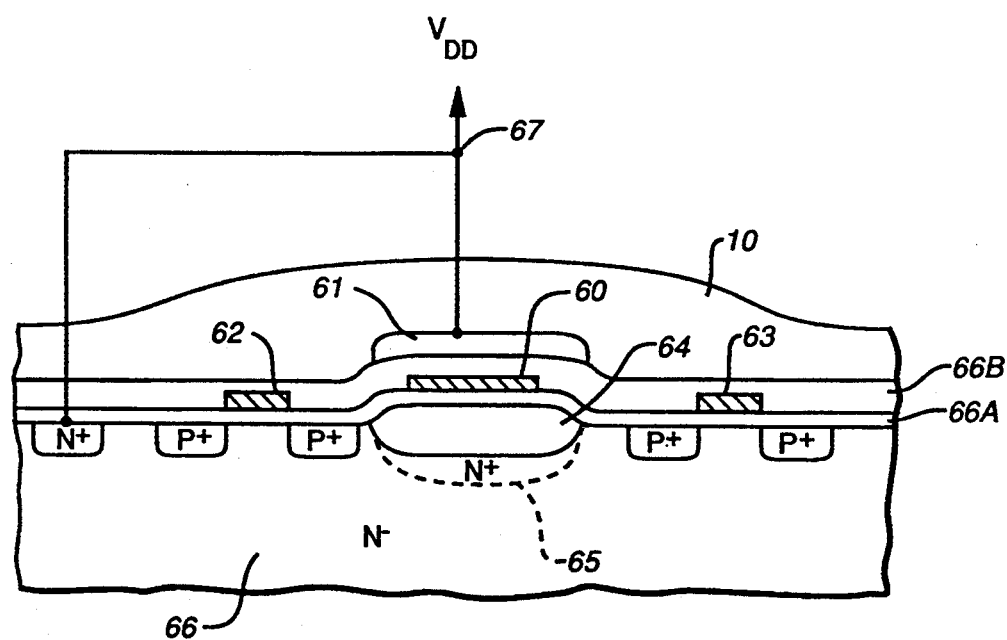
FIG._6

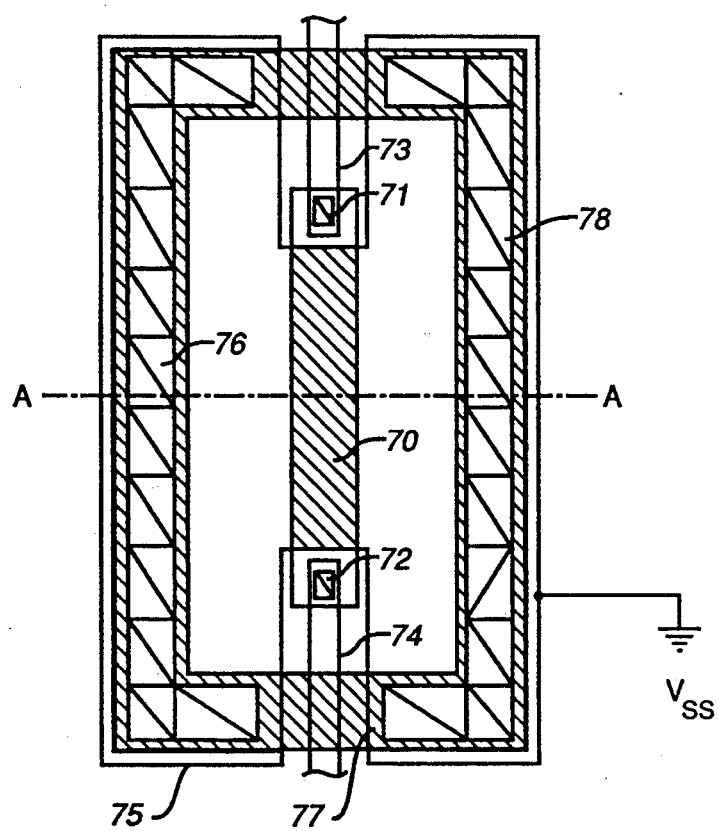
FIG._7A
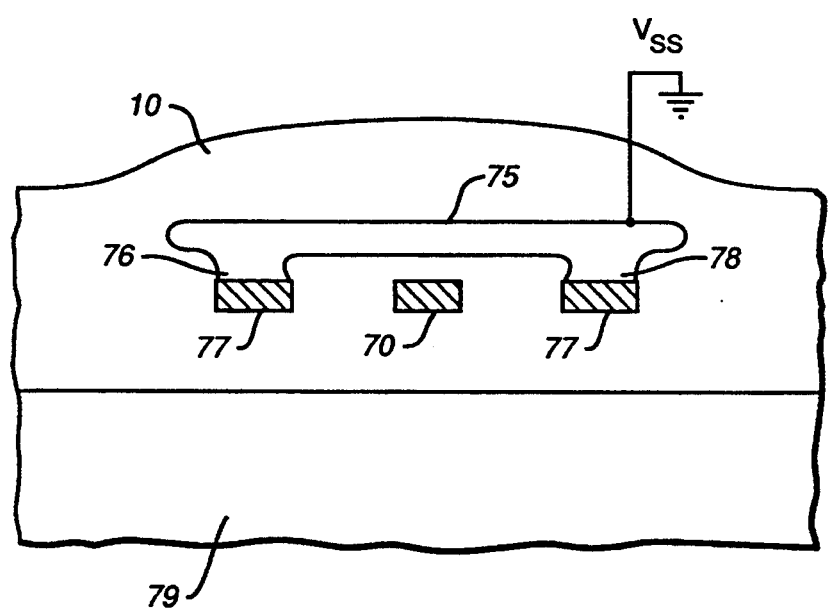
FIG._7B

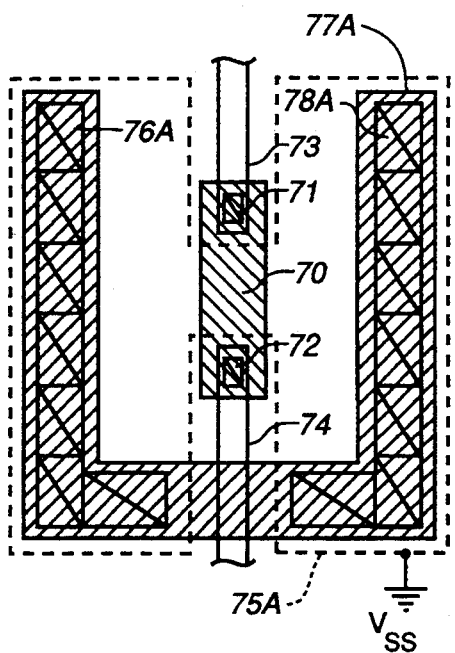
FIG._7C
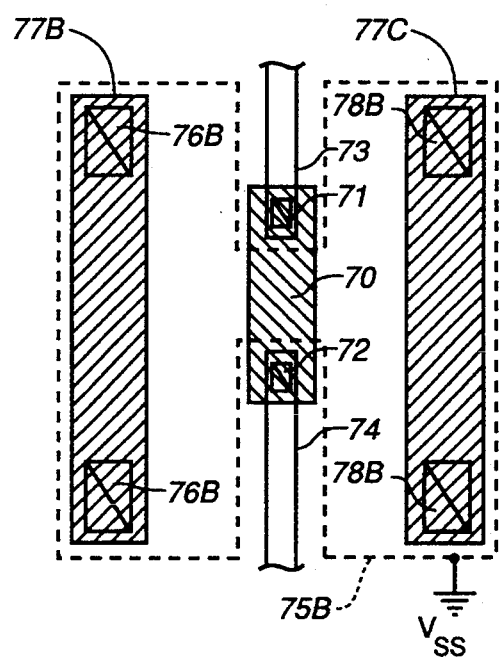
FIG._7D
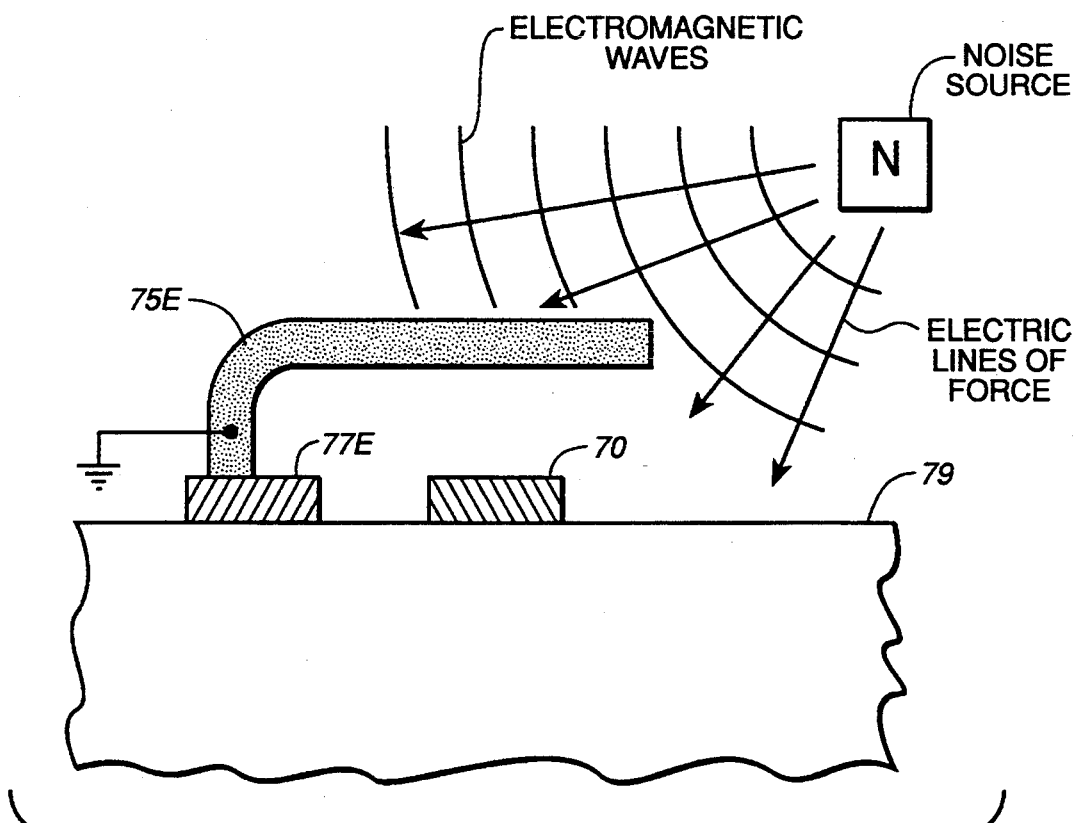
FIG._7E

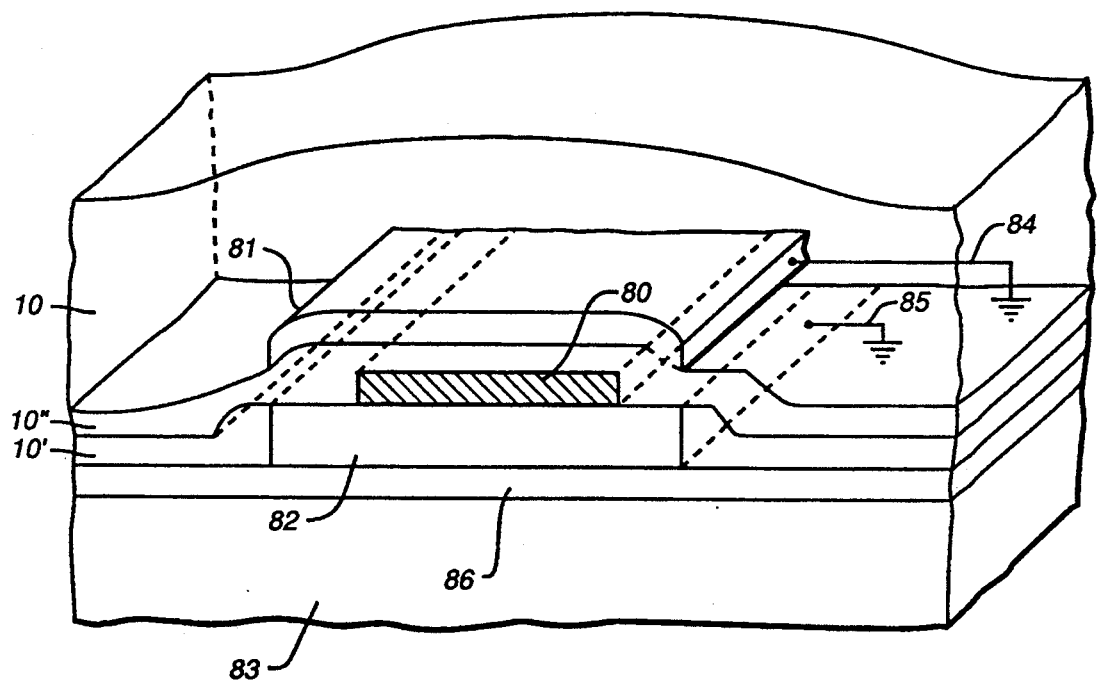
FIG._8
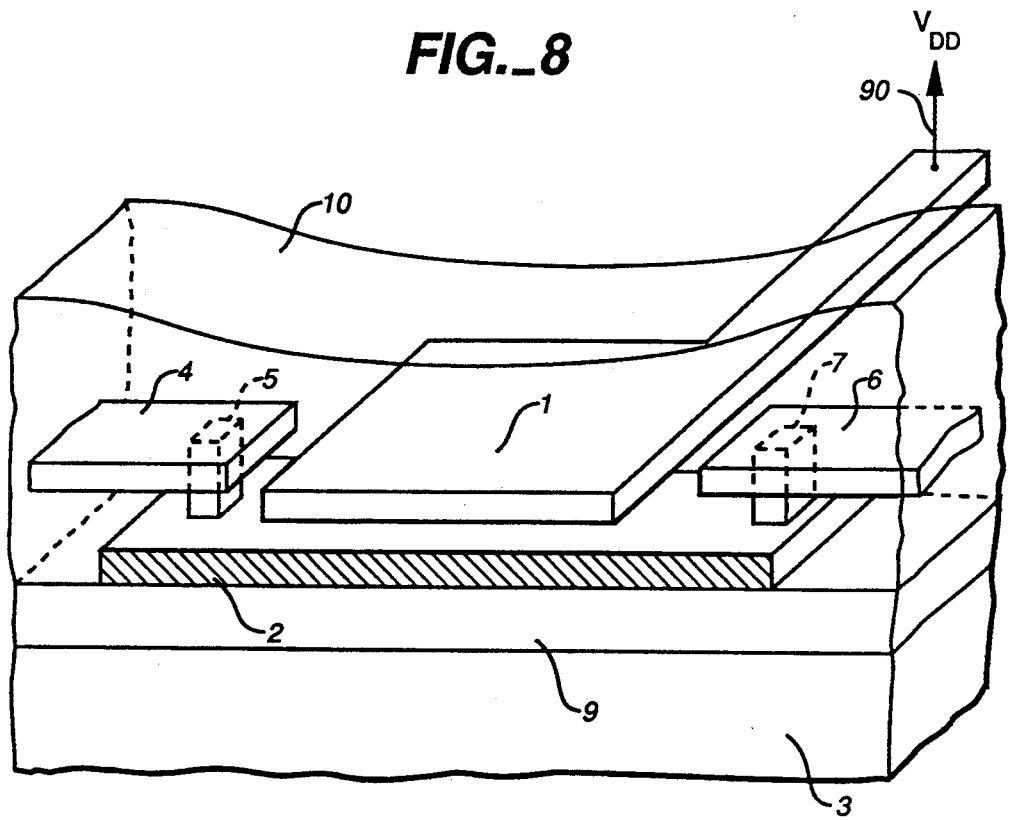
FIG._9A

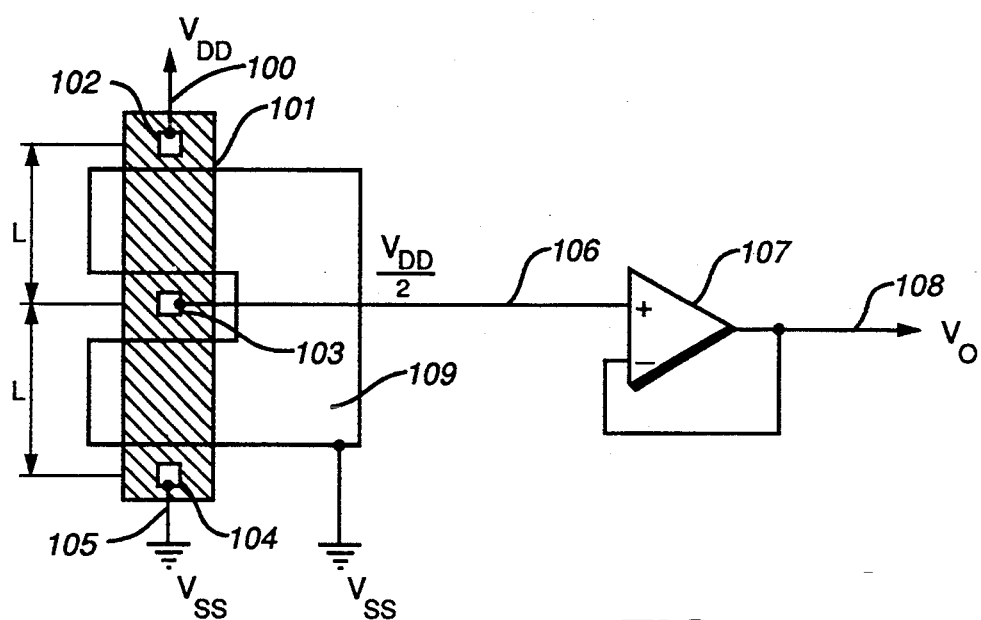
FIG._10
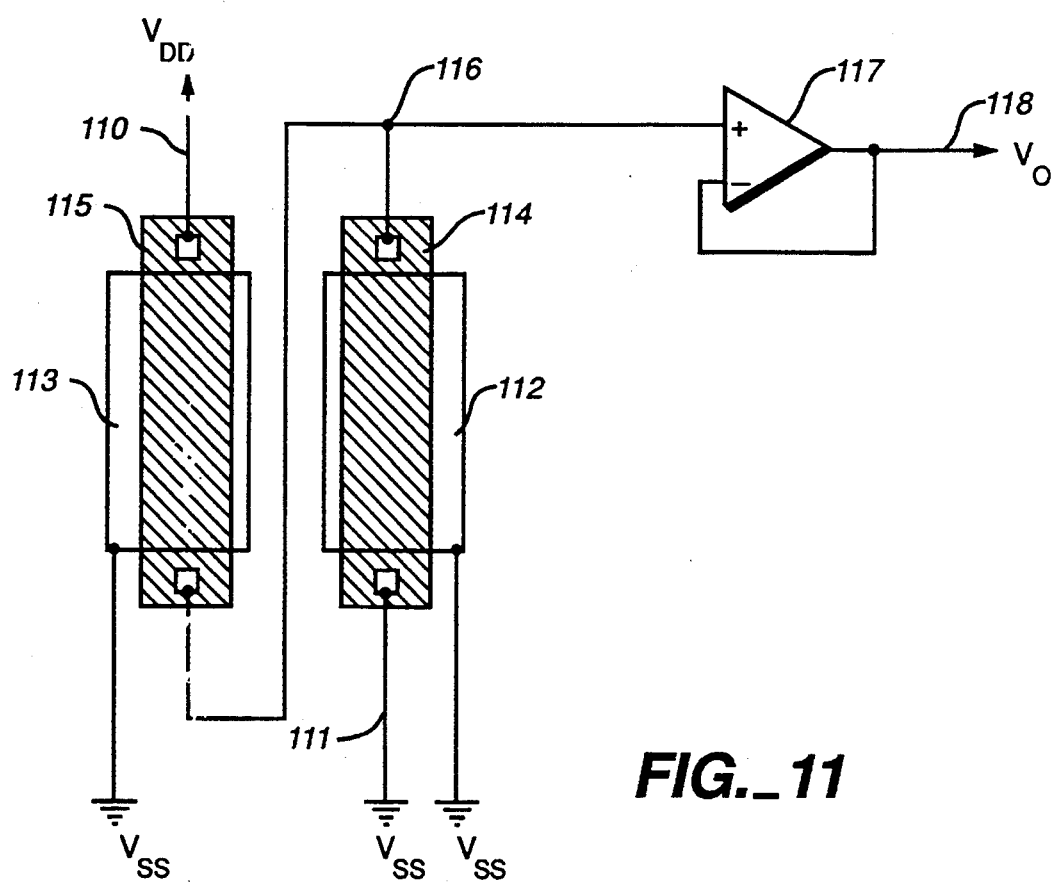
FIG._11

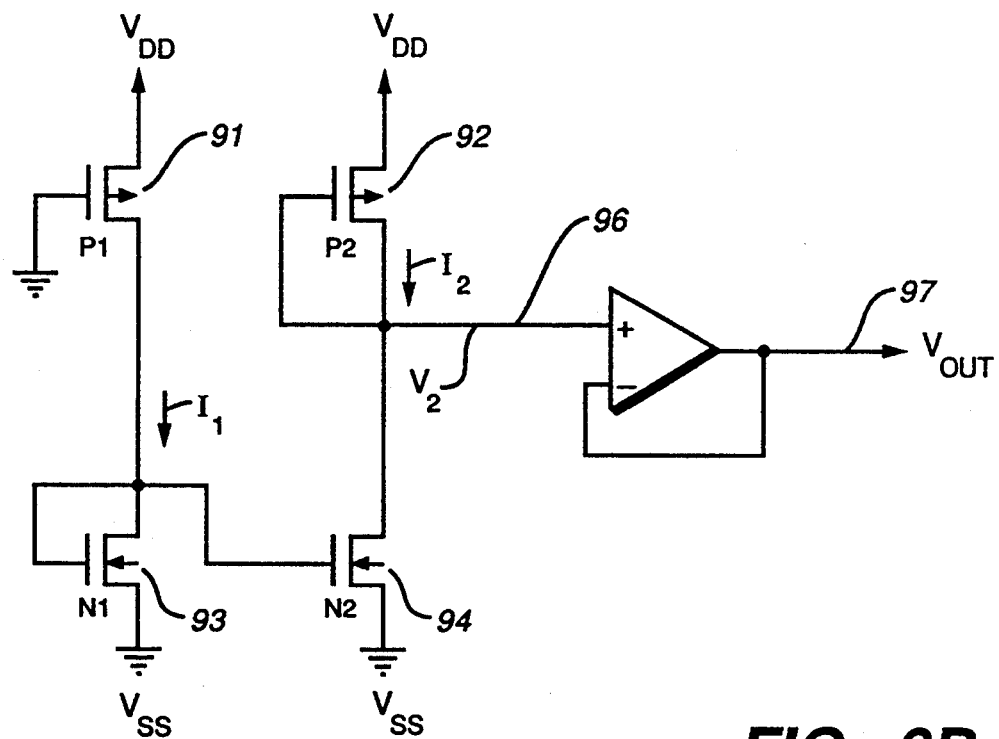
FIG._9B
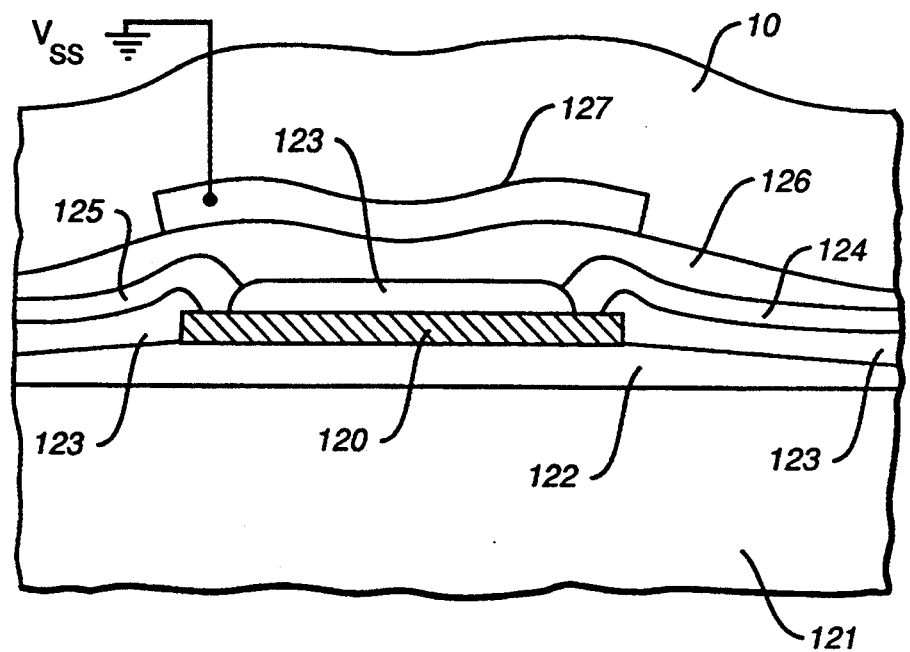
FIG._12

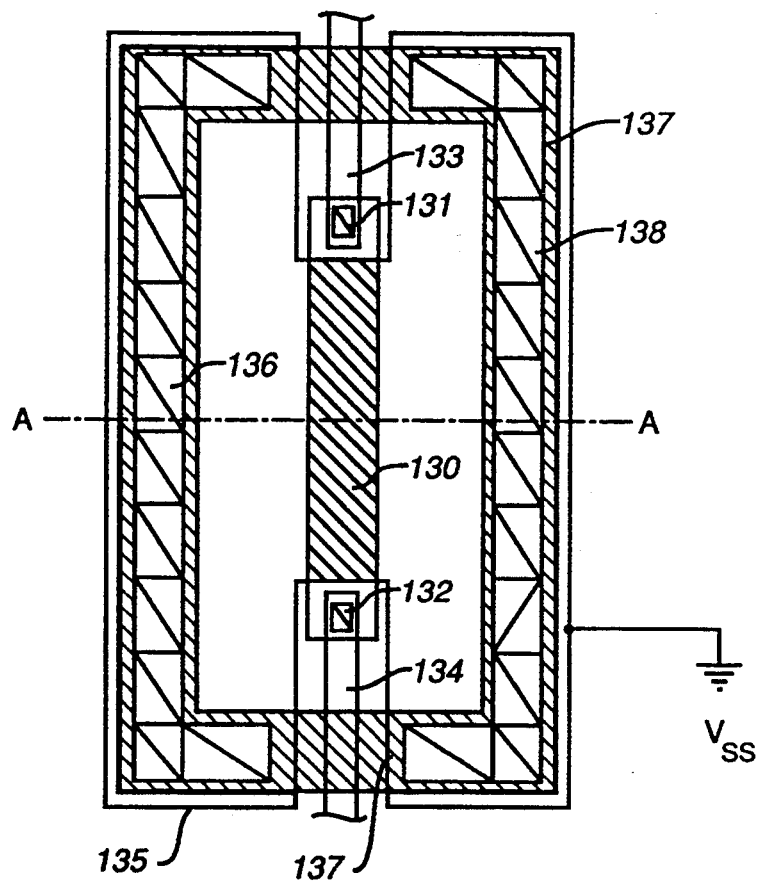
FIG._13A
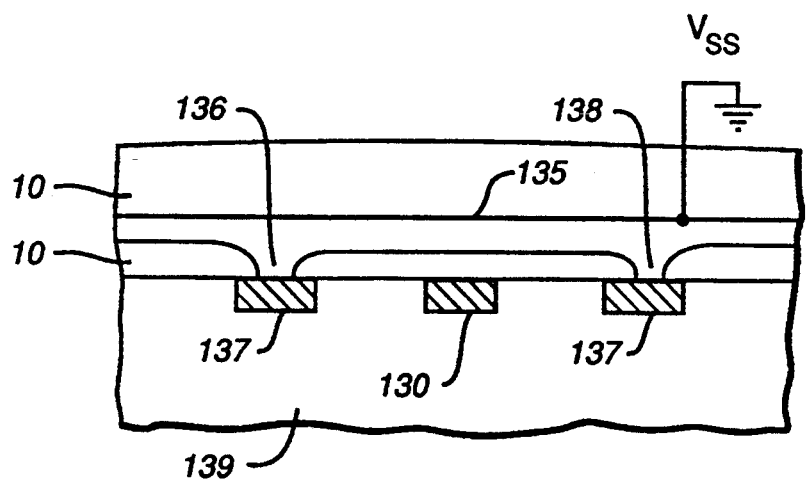
FIG._13B

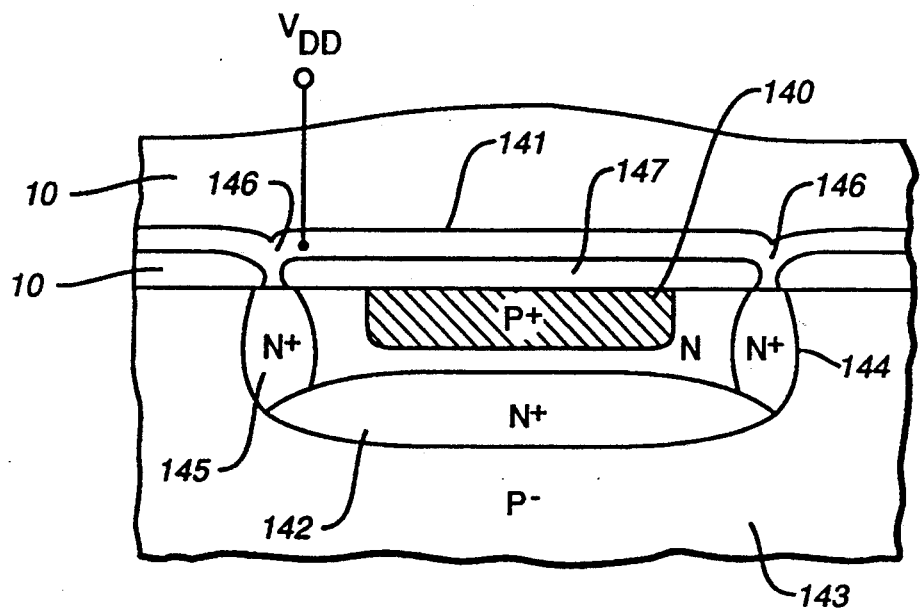
FIG._14
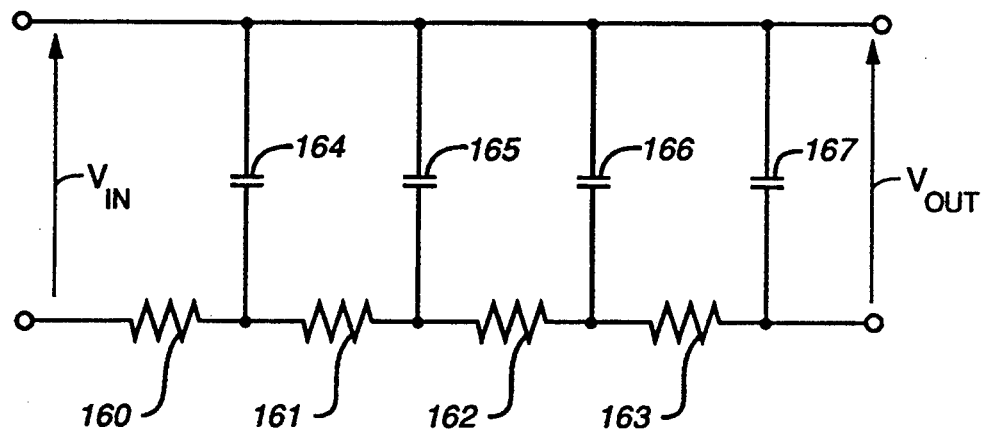
FIG._16

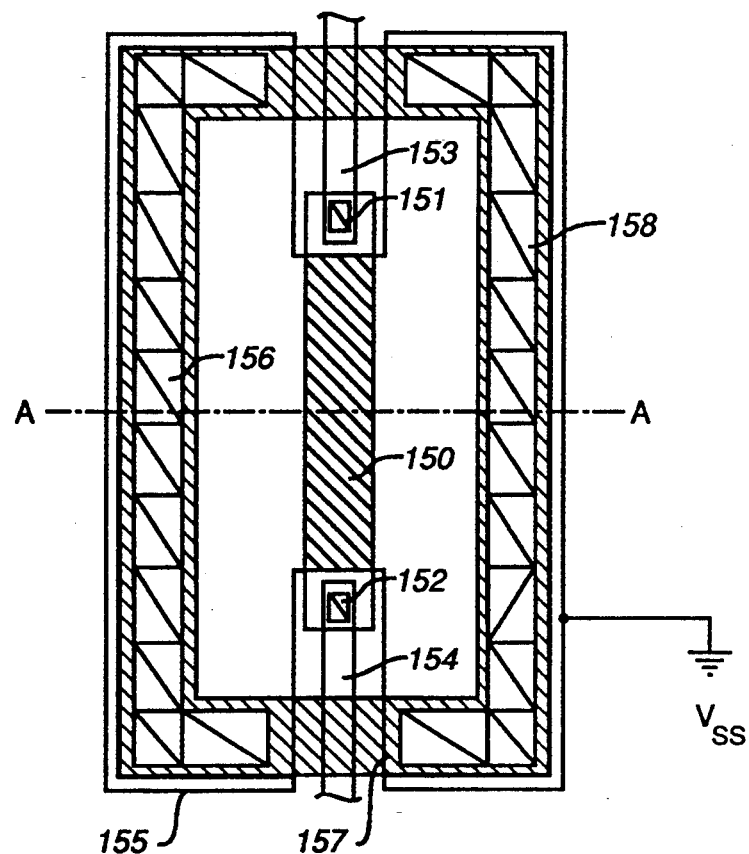
FIG._15A
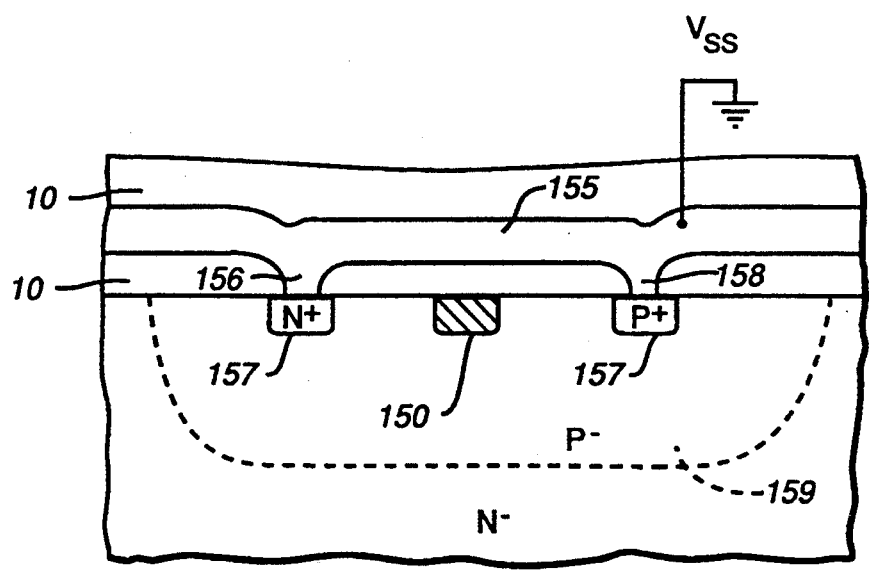
FIG._15B

SEMICONDUCTOR DEVICES WITH SHIELDING FOR RESISTANCE ELEMENTS

This is a continuation-in-part (CIP) of application Ser. No. 07/548,879, filed as PCT/JP89/01180, Nov. 21, 1989, now abandoned.

TECHNICAL FIELD

The present invention relates to a high precision resistance element structure employed in a semiconductor device.

BACKGROUND ART

FIG. 1 is a structural diagram illustrating a conventional polycrystalline silicon resistance element and, in particular, a high resistance element which is formed on a semiconductor substrate. A polycrystalline silicon 2 is formed on semiconductor substrate 3 through insulating or oxide film 9 and is connected to aluminum electrodes 4 and 6 through contacts 5 and 7. Insulating film 10 is formed over the top surface of polycrystalline silicon 2 which overlays only aluminum signal lines or an oxide protective film.

FIG. 2 is a structural diagram illustrating a conventional resistance element 12 is formed on semiconductor substrate 13 using a low concentration diffusion or an ion implanted diffusion. Diffused resistor 12, formed on a surface of the semiconductor substrate 13, is connected to aluminum lines 14 and 16 through contacts 15 and 17. An insulating or oxide film 10 is formed over diffused resistor 12. The insulating film overlays only either other signal line of polycrystalline silicon or aluminum, or an oxide protective film.

However, in the case of the conventional structure shown in FIG. 2, a depletion layer occurs on the surface of resistance element 12 due to an electrical field from signal line passing to resistance element 12 and causes an increase in resistance value. In case where the depth of the depletion layer reaches to a degree that it is not able to be ignored with respect to the diffusion depth of resistance element 12, the resistance value greatly varies. An ion implanted resistance element with a depth of less than 1 μm and a sheet resistance of 6 to 9 KΩ illustrates the phenomenon in a remarkable manner, and its resistance value may vary over several percent to several tens of percent.

Similarly, in case a high value resistance polycrystalline silicon 2 relative to FIG. 1, which is protected only by an oxide film 10, its resistance value is often varied due to impurity ions which permeate into the polycrystalline silicon.

A semiconductor element varies by nature its energy level in response to an incident light. Therefore, there has been a disadvantage that a resistance value is varied in response to light such as visible ray, infrared ray, or ultraviolet ray irradiated onto a semiconductor device.

DISCLOSURE OF INVENTION

A semiconductor device structure according to the present invention is characterized by the employment of a low resistance conductor formed over at least a diffused resistor or a polycrystalline silicon resistance element formed by low concentration diffusion or ion implantation with the conductor resistance being lower than that of the resistance element and wherein the low resistance conductor is kept at a fixed potential.

The embodiments disclosed comprise a conductor connected to a fixed potential is formed over at least a low concentration diffused resistor or an ion implanted resistor, or a high resistance value polycrystalline silicon. Such a structure can shield such a resistor or resistance from impurity ions or from an electromagnetic field due to signal lines in close proximity thereby causing a variation in its resistance value. Hence, the structure of this invention can maintain a stable resistance value for a low concentration diffused resistor or a polycrystalline silicon resistor and can prevent variation in the resistance value due to irradiated light.

In accordance with one embodiment of this invention, a semiconductor device provides for shielding for resistance element for stabilization of its resistance value from electric fields and other integrated circuit regional noise and comprises a polycrystalline silicon formed resistance element formed within an insulating medium of the semiconductor device wherein the resistance element is spaced a prescribed level above a major support surface, such as, a semiconductor or insulating support layer or substrate and extends in a plane substantially parallel with the plane of the support major surface. A conductive element comprising polycrystalline silicon or a conductive metal, such as aluminum, is formed within the same insulating medium at the same prescribed level as the resistance element and is laterally spaced from the resistance element so that the resistance element and the conductive element are formed in substantially the same lateral plane. Further, the conductive element surrounds at least a substantial portion of the resistance element in the lateral plane and, for example, may surround the resistance element in spaced relation along at least portions of or all of two, three or four sides of the resistance element.

Furthermore, a conductive shield layer may be formed in the same insulating medium overlying and spaced from the resistance element, which conductive shield layer also extends over at least a portion the conductive element. A peripheral region of the conductive shield layer is connected vertically through the insulating medium to upper surface regions of the conductive element along at least a portion of its length. In one form of this invention, therefore, a conductive shield spatially overlies all of the resistance element and spatially extends along at least a substantial portion of its side regions to substantially encompass the top surface and sides of the resistance element to shield it from the influence of electric fields, which are effective in substantially reducing or otherwise varying its resistance value during circuit operation.

This invention is equally applicable to other integrated passive elements, such as, capacitors as well as to integrated active elements, such as, transistors, in improving their stability of operation through the shielding technique of this invention.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a structural diagram for a conventional polycrystalline silicon resistance element.

FIG. 2 is a structural diagram for a conventional diffused resistance element.

FIG. 3 is a structural diagram for a polycrystalline silicon resistance element according to the present invention.

FIG. 4 is a structural diagram for a diffused resistance element according to the present invention.

FIG. 5 is a structural diagram for a polycrystalline silicon resistor formed on a LOCOS according to the present invention.

FIG. 6 is a structural diagram for a polycrystalline silicon resistor with a stopper formed beneath a LOCOS according to the present invention.

FIG. 7A is a plan view of a polycrystalline silicon resistor surrounded by a shielding material made of the same material as that of the resistor, and FIG. 7B is a cross sectional view thereof taken along the line A—A of FIG. 7A.

FIG. 7C is another embodiment similar to the embodiment shown in FIGS. 7A and 7B.

FIG. 7D is a still another embodiment similar to the embodiment shown in FIGS. 7A and 7B.

FIG. 7E is a still further embodiment illustrating partial shielding and is descriptive of the functionality of partial shielding shown in FIGS. 7C and 7D.

FIG. 8 is a structural diagram for a polycrystalline silicon resistor element wherein a pair of conductors cover both the top and under surfaces of the resistor element according to the present invention.

FIG. 9A is a structural diagram for a polycrystalline silicon resistor element covered with a conductor connected to a potential $V_{DD}$, according to the present invention, and FIG. 9B is an embodiment illustrating a circuit for providing a conductor potential to the conductor shown in FIG. 9A.

FIG. 10 is an application circuit with an intermediate tap for dividing an output voltage according to the present invention.

FIG. 11 is an application circuit for a pair of resistance elements for dividing an output voltage according to the present invention.

FIG. 12 is a cross sectional view for a polycrystalline silicon resistor with two-layered metal lines as shielding according to the present invention.

FIG. 13A is a plan view for a diffused resistor surrounded with a shielding material made of the same material as that of the resistor according to the present invention, and FIG. 13B is a cross sectional view thereof taken along the line A—A of FIG. 13B.

FIG. 14 is a cross sectional view for a diffused resistance element wherein the top and under layers are covered with a shielding conductor provided above and below the element according to the present invention.

FIG. 15A is a plan view for a diffused resistance element surrounded with a stopper according to the present invention, and FIG. 15B is a cross sectional view thereof taken along the line A—A of FIG. 15B.

FIG. 16 is an equivalent circuit diagram for a high frequency delay line circuit employing a shielding conductor covered resistance element according to the present invention.

BEST MODE FOR CARRYING OUT THE INVENTION

FIG. 3 is a structural diagram illustrating a fundamental shielding structure for a polycrystalline silicon resistance element. Polycrystalline silicon resistance element 2 is connected at opposite ends to respective contacts 5 and 7. Electrodes 4 and 6 are made of aluminum material. A low resistance conductor 1 is formed over polycrystalline silicon 2 intermediate of insulating or oxide film 10 so as to cover at least a half the plane area of polycrystalline silicon element 2 and is supplied with a fixed potential, for example, a low power source potential $V_{SS}$ 8, a high power source potential $V_{DD}$, or the intermediate potential thereof.

Such a resistance element structure has the following advantages. First, noise from the signal line arranged over the low resistance conductor 1 and the external field created by the current can be shielded from the resistance element. Thus, electrical and magnetic noise created from stray capacitance and stray inductance in the vicinity of resistance element 2 is removed by the electrostatic shielding effect of biased low resistance conductor 1. Hence, resistance element 2 will not vary in its current vs voltage characteristics, i.e., its resistance value, during operation of the semiconductor device incorporating such a structure and the stability and high precision value of resistance element 2 is maintained.

Moreover, external positive or negative ions are blocked from invading such a resistance element after its manufacture. In other words, ions charged positively more than the potential of low resistance conductor 1 are repelled away from resistance element 2, while negatively charged ions are attracted to low resistance conductor 1. Also, while a semiconductor device is in the energized state, the ion distribution is uniformed around low resistance element 2, and the influence of an electric field due to the external ions can be prevented.

As a result, resistance value variations of element 2 due to aging can be prevented. Also, low resistance conductor 1 can shield resistance element 2 from the influence of external light. Since the high resistance value polycrystalline silicon resistor is made of a semiconductor material, the light energy of visible rays, infrared rays, or ultraviolet rays transmits electron energy, which can change the characteristics of the resistance value. These problems can be solved by covering the resistance element with a low resistance conductor functioning as a physical protective material to obtain a stable resistance element.

As described above, the characteristic variations of the resistance element under influence from an external field can be prevented. Similarly, as a countermeasure, noise, electric field, and magnetic field generated from the resistance element itself can be prevented from affecting surrounding circuit elements. In particular, in a high speed circuit, the resistance element, through which current abrubtly changes, generates a large thermal noise and unnecessary radiation and the present invention is effective for such a circuit. In the present invention, a resistance material may be effectively employed comprising a non ion- or slightly ion-implanted high resistance polycrystalline silicon, also referred to as a High-resistance, other semiconductors, and a semiconductor-metal compound material, in addition to the use of a P-type polycrystalline silicon or a N-type polycrystalline silicon.

A metal, such as, aluminum, tungsten, molybdenum may be generally employed as a low resistance material. In addition, a polycrystalline silicon, a gallium and arsenic series compound and a superconductivity material may also be effectively used.

FIG. 5 is a diagram illustrating a polycrystalline silicon resistor formed over a selective oxide film generally known in the art as LOCOS, a surface of a semiconductor substrate LOCOS 53 is formed over semiconductor substrate 55 and polycrystalline silicon resistor 50 is formed on LOCOS 53 via oxide film 52. Aluminum conductor 51 covers resistor 50 via oxide film 56, and is connected to a power source $V_{ss}$ 54. Resistance element 50 formed on the LOCOS provides the following advantages. First, the thick LOCOS film prevents the formation of a parasitic transistor immediately below polycrystalline silicon resistor 50. Secondly, the spacing between substrate 55 and resistance element 50 decreases the parasitic capacitance between resistance element 50 and substrate 55. Third, current leakage due to a pin hole formed below resistance element 50 can be easily prevented. In FIG. 5, resistance element 50 covered with low resistance conductor 51, will increase the stability, high accuracy, and reliability of resistor 50.

FIG. 6 is a diagram illustrating an application comprising a high concentration diffused region arranged immediately below the LOCOS. In FIG. 6, a heavily doped N+stopper 65 is arranged in a P-channel region, and is supplied with a potential $V_{DD}$ through substrate 66. A polycrystalline silicon resistor 60 is formed over LOCOS 64, via oxide film 66A, and the top surface of resistor 60 is covered with oxide film 66B followed by formation of aluminum conductor 61 which is connected to a potential $V_{DD}$ 67. Such a structure vertically shields resistor 60 with $V_{DD}$ provided by employing aluminum conductor 61 and N+ stopper 65. Hence, the structure provides effectively a resistance element with stable characteristics and improved withstanding voltage characteristics. The same effect is obtained by arranging a P+ stopper into the P+ well under a LOCOS in an N-channel region and applying a potential $V_{SS}$ to the P+ stopper and the aluminum conductor.

FIG. 7A is a plan view showing an embodiment wherein the resistor is shielded with the same material as that of the resistor. FIG. 7B is a cross sectional view of the above structure taken along the line A—A of FIG. 7A. In order to boost the shielding effect derived from the present invention, it is desirable to form a shielding material having the same height as that of the resistance element, i.e., the elevation above the substrate as the position of resistance element 70. Polycrystalline silicon 77 is arranged around polycrystalline silicon resistance element 70, and aluminum conductor 75 is formed so as to cover completely the structure. If possible, contacts 76 and 78 should be formed into aluminum conductor 75 and the polycrystalline silicon 77. The structure decreases the resistance value of the polycrystalline silicon 70, and provides a good shielding effect on the low resistance conductor. In FIG. 7A, conductor portions 73 and 74 are part of aluminum conductor 75 and an aluminum line in the same level connected to polycrystalline silicon 70 via contacts 71 and 72.

Shield 75 in FIG. 7A has a an "H" configuration wherein the ends of resistance element 70 are connected through vias of respective contacts 71 and 72 to corresponding conductor portions 73 and 74 wherein conductor portions 73 and 74 are at an overlying elevation in the semiconductor structure above the level of resistance element 70 and polysilicon conductive shield base member 77. In this connection, it should be understood that conductive shield 75 could be limited to the region immediately above resistance element 70, but by its extension to surround the body of element 70, a more effective and comprehensive shielding structure is achieved. Shield base member 77 may also be made of metal, such as, aluminum.

An important aspect of the structure of FIGS. 7A and 7B is that the degree of difficulty in the masking operation and fabrication of the shield base member 77 and overlying shield 75 is low. For example, resistance element 70 and shield base member 77 may be fabricated from the same layer, such as polycrystalline silicon, wherein the member 77 is doped to be highly conductive and shield 75 is doped to be highly resistive. The overlying shield 75 is made by initially forming contact holes or vias through an insulating layer (e.g., $SiO_2$) formed over element 70 and base member 77. The contact holes are formed along at least a portion of base member or members 70. This is followed by the deposition of a conductive film, such as aluminum, over the insulating layer as well as the formed vias so that a shield structure is formed over resistance element 70 and is connected directly to base member 70 through the formed vias.

It should be realized that shield base member 77 need not take the closed loop configuration as shown in FIG. 7A. This member may need only surround a portion of resistance element 70 and will still be substantially effective in accomplishing a sufficient shielding effect so that resistance value variation due to field effects is made to have minimal effect. In this connection, FIG. 7C illustrates another embodiment wherein shield base member 77A has a U-shaped configuration and is formed in the same lateral plane with element 70 within the insulating layer. Overlying H-configured conductive shield 75A is connected to member 77 through respective vertically disposed contacts 76A and 78A formed in the insulating layer. The resulting shield structure provides for a partial claim shell like enclosure for resistance element 70 with resistance element 70 surrounded substantially on three sides by conductive shielding.

FIG. 7D illustrates another embodiment wherein resistance element 70 is surrounded only on two sides. In this embodiment, adjacent sides of resistance element 70 have respective shield base members 77B and 77C that are parallel with element 70 and are formed in the same lateral plane with element 70 within the insulating layer. Overlying H-configured conductive shield 75B is connected to respective members 77B and 77C through contact vias 76B and 78B positioned, for example, at the four corner regions of the structure. Thus, the vertical connection between shield 75B and parallel strip members 77B and 77C need not be continuous along their length to realize the benefits of the shielding effect achieved by this structure.

A sufficient shielding effect is brought about by the partial shielding structures of FIGS. 7C and 7D because the shield structure prevents resistance element 70 from being effected by the external electromagnetic fields by shutting out electric field lines of force produced from the electromagnetic field as illustrated in FIG. 7E. The electric field lines of force are absorbed by partial conductive shield structure 75C connected to shield base element 77E. Thus, if a partial shield structure 75E is utilized, a substantial shielding effect can be realized even if the shield structure does not fully surround resistance element 70. Generally, the energy level of noise source, N, is fairly weak so that shield base 77E as well as conductive shield 75E can be fabricated taking into account minimal spacing relative to resistance element 70 in order to enhance the degree of circuit integration of large scale integration (LSI). Thus, the partial shielding structures of FIGS. 7C–7E are sufficiently effective for practical application as illustrated in FIG. 7E.

FIG. 8 is a structural diagram showing a shielding layer formed on a lower portion of the resistance element. Conductor 82 is formed over semiconductor substrate 83 via oxide film 86 and through oxide film 10', and is connected to potential $V_{SS}$ 85. Second polycrystalline silicon resistance element 80 is formed through oxide film 10'', and is covered with aluminum conductor 81 through oxide film 10, aluminum conductor 81 being connected to a potential $V_{SS}$ 84. The structure provides effectively a stable resistance element because of vertically shielded resistance element 80. The above effect is improved more by taking many contacts between the first polycrystalline silicon and the power source $V_{SS}$ because the first polycrystalline silicon has a higher resistance than aluminum. Particularly, the effect is improved more by forming power source contacts to at least both the ends of each polycrystalline silicon conductor which are arranged between a resistance element in order to provide uniform potential to various portions of the polycrystalline silicon.

FIG. 9A is a structural diagram showing a resistance element wherein a potential $V_{DD}$ 90 is supplied to low resistance conductor 1 as shown in FIG. 1. The potential $V_{DD}$ 90 may be replaced for potential $V_{SS}$ in performing the shielding effect.

FIG. 9B is an example illustrating a transistor circuit for producing an intermediate potential between the potentials $V_{DD}$ and $V_{SS}$ to a low resistance conductor assuming that the driving capabilities of MOS transistors 91, 92, 93 and 94 are $\beta_{P1}$, $\beta_{P2}$, $\beta_{N1}$ and $\beta_{N2}$, respectively, the potential $V_2$ of the signal 96 is expressed as follows:

$$V_2 = V_{DD} - \sqrt{(\beta_{N2} \cdot \beta_{P1})/(\beta_{P2} \cdot \beta_{N1})} \times (V_{TP2} - V_{TP1})$$

where $\beta_{P1}=\beta_{P2}, \beta_{N1}=\beta_{N2}, V_{TN1}=V_{TN2},$
$V_{DD}-V_2=V_{TP2}-V_{TP1}.$ Hence, the output voltage $V_{OUT}$ at 97 is expressed below by taking $V_{DD}$ as a reference voltage:

$V_{OUT}=V_2.$

In order to improve the shielding effect, it is necessary to lower the output impedance for intermediate potential $V_2$. In FIG. 9B, output 97 is obtained by using a differential pair circuit as a $V_2$ voltage follower.

The depletion effect is one cause for variations to the shielded resistance element and can be compensated by varying the potential of the shield in cooperation with the temperature characteristics of the shielded resistance element.

FIG. 10 is an application circuit diagram showing a resistor with an intermediate tap 103. This circuit outputs an intermediate voltage through an output operational amplifier 107 by dividing the resistor into two portions.

Polycrystalline silicon resistor 101 has a contact 102 connected to potential $V_{DD}$ 100, a contact 104 connected to potential $V_{SS}$ 105, and a contact 103 formed at the intermediate portion thereof to output a signal potential $V_{DD}/2$ at 106. Aluminum conductor 109, which is connected to the potential $V_{SS}$, covers the upper portion of polycrystalline silicon resistor 101. Hence, resistor 101 is shielded from ambient noise or magnetic field, and a partial resistance variation can be prevented. The output $V_0$ 108 is accurately at $V_{DD}/2$.

FIG. 11 is an application circuit diagram employing two resistors for the same purpose as described for FIG. 10. Two polycrystalline silicon resistors 114 and 115 are serially connected between potential $V_{DD}$ 110 and $V_{SS}$ 111. The operational amplifier 117 receives signal 116 at the intermediate node thereof, and provides an output voltage $V_O$ 118.

In order to obtain $V_O=V_{DD}/2$, the resistors 114 and 115 have the same structure. Aluminum conductors 113 and 112 are formed on resistors 114 and 115 to prevent an influence due to ambient noise and magnetic field, and are supplied with the same potential $V_{SS}$. Such a structure outputs a stable voltage $V_O$.

The above voltage divider has a wide variety of applications. A potential $V_{DD}/3$ or $V_{DD}/4$ can be easily obtained with a three or four serially connected resistor configuration.

In order to design a layout of a semiconductor integrated device using a standard cell process, an automatic arranging and wiring process can be performed by registering in a predetermined manner relative to one cell with resistors and aluminum conductors covering them.

FIG. 12 is a structural diagram showing a two layered aluminum structure. Polycrystalline silicon resistor 120 is formed over substrate 121 through oxide film 122. Resistor 120 with electrodes 124 and 125 functions as a resistance element. Both electrodes 124 and 125 are made of a first aluminum wiring layer. A second aluminum wiring layer 127 is formed over polycrystalline silicon resistor 120 through oxide films 123 and 126, and is supplied with the potential $V_{SS}$. In this case, the shielding effect may be reduced somewhat because of the spacial distance between resistance element 120 and shield material 127 compared to the case of the single layered aluminum wiring. However, since there is no need for the shield pattern to take a roundabout way off of the contacts to the resistance element thereby simplifying the design.

In the above mentioned embodiments, polycrystalline silicon has been employed as a silicon material. However, a diffused resistor buried in a semiconductor substrate may be applied to form a stable resistor utilizing the shielding effect.

FIG. 4 is a fundamental structural diagram showing a diffused resistor applying the principals of the present invention. Contacts 15 and 17 are formed at both the ends of a diffused resistor 12, and aluminum lines 14 and 16 are utilized as electrodes. Aluminum conductor 11 covers at least half of the area of diffused resistor 12 through an oxide 10, and is supplied with a potential $V_{SS}$ 18. In this structure, aluminum conductor 11 functions as a shielding material, and effectively provides for a stable and high precision diffused resistor because conductor 11 shields resistor 12 electrically external electromagnetic noises, light, and ions, and blocks any physical contamination.

As a material for a diffused resistor according to the present invention utilized for low concentration diffused resistors including a P− well resistor formed into an N− substrate, an N− well resistor formed in to a P− substrate, and high concentration diffused resistors including ion implanted P+ and N+ resistors.

A metal-semiconductor compound and superconductive material may be used as a low resistance conductor material in addition to aluminum and polycrystalline silicon.

A variety of different combinations of a diffused resistor and shield material can be realized and examples are shown in FIGS. 13-16.

FIG. 13 is a structural diagram showing an embodiment wherein the same diffusion material covers around the diffused resistor. FIG. 13A is a plan view. FIG. 13B is a cross sectional view taken along the line A—A of FIG. 13A. A diffused resistor 130 is formed in a shallow portion of semiconductor substrate 139. The same material 137 forms the peripheral portion of resistor 130. Aluminum conductor 135 covers the top portion of diffused resistor 130 through oxide film 10, and is connected to diffused material 137 and contacts 136 and 138 to receive the power source potential $V_{SS}$. The structure of FIG. 13 improves the shielding effect against electromagnetic noise generated from the source and drain of an ambient transistor or a diffused resistor. In FIG. 13A, aluminum electrodes 133 and 134 are at the same level as aluminum conductor 135 and are connected to diffused resistor 130 through contacts 131 and 132.

FIG. 14 is a structural diagram showing a shield conductor formed on the under portion of a diffused resistor. N+ buried layer 142 and high impurity concentration N type epitaxial layers 144 and 145 are formed in P− substrate 143. Contact 146 is connected to the potential $V_{DD}$. Aluminum conductor 141 covers P+ diffused resistor 140 via oxide film 147, and is connected to the potential $V_{DD}$. The structure provides a stable and extremely high precision diffused resistance element because of a complete shielding around diffused resistor 140.

In the embodiments shown in FIGS. 13 and 14, the resistance element is shielded horizontally and vertically so that it is possible to effectively prevent any influence from a substrate current generated by the switching operation of a transistor in proximity to a current path when light or α rays are irradiated onto the semiconductor integrated device.

FIG. 15A is a plan view showing a diffused resistor surrounded by a stopper and FIG. 15B is a cross sectional view taken along the line A—A of FIG. 15A. N type diffused resistor 150 is formed on a surface of the P− well 159 in an N− substrate. A P+ stopper 157 is formed so as to surround the N type diffused resistor 150, and is supplied with the potential $V_{SS}$ from aluminum conductor 155 through contacts 156 and 158. This structure can effectively prevent a latch-up phenomenon in addition to the shielding effect to ambient electromagnetic noise.

In case of an inverted type semiconductor a P type diffused resistor is formed on an N− substrate, and surrounded by a N+ stopper. An aluminum conductor is formed over the diffused resistor and the N+ stopper, and connected to the potential $V_{DD}$. This structure also can effectively prevent electromagnetic noise and the latch-up. In FIG. 15A, aluminum electrodes 153 and 154 are at the same level as aluminum conductor 155, and are connected to resistor 150 by way of contacts 151 and 152.

Relative to the above mentioned electrostatic shielding effect wherein a conductor surrounds a diffused resistor and is supplied with a fixed potential, the fixed potential power source may be $V_{SS}$, $V_{DD}$ or an intermediate potential in a manner similar to that described relative to a polycrystalline silicon resistor. In case of single diffused resistance voltage divider with an intermediate tap is used, the resistance value stability is effectively improved by covering the circumference of the divider with an conductor connected to a fixed potential. Also, the present invention can be applied as voltage divider employing a plurality of diffused resistance elements.

FIG. 16 is an equivalent circuit diagram showing a high frequency delay line employing a shielded resistor according to the present invention. A conductor, which is connected to a fixed potential, surrounds resistors 160 to 163, and capacitors 164 to 167 have a stable capacitance value. The shielded resistors provide good resistance value and stability. A signal is provided at the input at the resistance terminal at $V_{IN}$, and is issued at the resistance terminal at $V_{OUT}$.

The forgoing described embodiments have a wide range of applications. A resistance element is one of most fundamental passive elements for circuit technologies and various integrated circuits requires high precision resistors. Particularly, the present invention can be widely applied in the following semiconductor integrated electronic devices: oscillation circuits, A/D converters, and sensor circuits which require resistors with absolute resistance value; D/A converters, voltage sensing circuits, and oscillation halt detecting circuits which require a mutual resistance precision between a plurality of resistors; static RAMs, EPROMs, and $E^2$-PROMs which require high value resistor with suppressed leak current.

Furthermore, the teachings according to present invention wherein a resistance element is shielded with a conductor can be applied to capacitors, transistors, or other related devices to improve their stability.

The present invention has an extremely wide range of applications because a stable and high precision resistance element is formed by employing existing manufacturing processing with the addition of minimal patterned shielding structure.

An improved resistance stability and precision means that an absolute resistance value of a resistor and a mutual resistance ratio between a plurality of resistance elements provides a resultant structure which is difficult to be affected by ambient electromagnetic noise. The structure according to the present invention is also difficult to be affected by ions and prevents variations in resistance values over time because the surface potential (generally of an oxide) of a resistance element is not electrically floating. Also, the structure can prevent variations in resistance element characteristics due to light, and can suppress electromagnetic noises generated from the resistance element itself. Furthermore, a lightly diffused high resistance element with high precision occupies a small area which results in a highly integrated semiconductor device.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A semiconductor device with shielding for a resistance element for stabilization of its resistance value from regional noise comprising:
   a semiconductor support having a major surface upon which is formed an insulating medium,
   said resistance element comprising polycrystalline silicon formed within said insulating medium, spaced a prescribed level from said semiconductor support major surface and extending in a plane substantially parallel with a plane of said semiconductor support major surface,
   a conductive element comprising polycrystalline silicon formed within said insulating medium and formed at said prescribed level and laterally spaced from said resistance element, wherein said resistance element and said conductive element are formed in said resistance element plane,
   said conductive element surrounding at least a substantial portion of said resistance element,
   a conductive shield layer formed in said insulating medium overlying and spaced from said resistance element, said conductive shield layer also extending over said conductive element with a peripheral region of said conductive shield layer directly connected through said insulating medium to upper surface regions of said conductive element along at least a substantial portion of its length and wherein a conductive shield is spatially formed overlying all of said resistance element and spatially extending along at least a portion of its side regions,
   said conductive shield element and said conductive element connected to a potential reference.

2. A semiconductor device having a buried shielding member for an integrated circuit component comprising:
   a support,
   an insulating medium formed on a major surface of said support,
   an integrated circuit component formed in said insulating medium at a prescribed level above said support major surface in a first plane substantially parallel with said support major surface,
   a conductive base shield member formed in said insulating medium at said prescribed level in said first plane, said base shield member comprising at least one strip spaced from and surrounding a substantial portion of said integrated circuit component,
   said integrated circuit component having at least two contact terminals, conductive wiring formed in said insulating medium in a region above and overlying said integrated circuit component, said contact terminals connected through vias to said corresponding conductive wiring,
   a conductive shield layer formed in said insulating medium in a second plane parallel to said first plane and overlying a substantial portion of said integrated circuit component, said conductive shield layer not overlying regions above the contact terminals, and
   said conductive base shield member connected to an electrical reference source.

3. The semiconductor device of claim 2 wherein boundary limits of said conductive shield member are connected through said insulating medium via a conductive interconnect contact to a surface of said conductive base shield member, said conductive base shield member and said conductive shield layer connected to an electrical reference source.

4. The semiconductor device of claim 3 wherein said conductive base shield member comprises a closed loop conductive strip surrounding said integrated circuit component.

5. The semiconductor device of claim 3 wherein said conductive base shield member comprises a U-shaped conductive strip surrounding said integrated circuit component.

6. The semiconductor device of claim 3 wherein said conductive base shield member comprises a pair of conductive strips formed along adjacent sides of said integrated circuit component.

7. The semiconductor device of any one of the claims 4, 5 and 6 wherein said interconnect contact is continuous between said conductive shield member boundary limits and length of said conductive strip or strips.

8. The semiconductor device of any one of the claims 4, 5 and 6 wherein said interconnect contact is intermittently between said conductive shield member boundary limits and length of said conductive strip or strips.

9. The semiconductor device of claim 3 wherein said support is a substrate.

10. The semiconductor device of claim 3 wherein said support is a semiconductive layer.

11. The semiconductor device of claim 3 wherein said conductive base shield member and said integrated circuit component are doped polycrystalline silicon selectively formed using a single mask.

12. The semiconductor device of claim 2 wherein said integrated circuit component comprises a resistance, capacitor or transistor.

13. A semiconductor device having a buried shielding member for an integrated circuit component comprising:
   a support having a major surface;
   an insulating medium formed on the major surface of said support;
   an integrated circuit component formed in said insulating medium at a prescribed level above said support major surface in a first plane substantially parallel with said support major surface;
   a conductive base shield member formed in said insulating medium at said prescribed level in said first plane, said base shield member comprising at least one conductive strip spaced from said integrated circuit component;
   a conductive shield layer formed in said insulating medium in a second plane parallel to said first plane and substantially overlying said integrated circuit component, said conductive shield layer being directly connected through said insulating medium to said conductive base shield member along at least a substantial portion of said base shield member; and
   said conductive base shield member and conductive shield layer connected to a potential reference.

14. The semiconductor device of claim 13 wherein said conductive base shield member surrounds at least a substantial portion of said integrated circuit component.

15. The semiconductor device of claim 13 wherein said integrated circuit component comprises a resistance element.

16. The semiconductor device of claim 13 further comprising at least two contact terminals connected to said integrated circuit and connected to conductive wiring formed in said insulated medium in a region above and overlying said integrated circuit component.

* * * * *

UNITED STATES PATENT AND TRADEMARK OFFICE
CERTIFICATE OF CORRECTION

PATENT NO.    : 5,428,242
DATED         : June 27, 1995
INVENTOR(S)   : Yasunari Furuya, et al.

It is certified that an error appears in the above identified patent and that said Letters Patent is hereby corrected as shown below:

In the Abstract

Line 2, change:

"other elongated passive" to --other integrated passive--.

Signed and Sealed this

Ninth Day of January, 1996

Attest:

BRUCE LEHMAN

*Attesting Officer*      *Commissioner of Patents and Trademarks*